United States Patent [19]

Pascucci

[11] Patent Number: 5,633,834
[45] Date of Patent: May 27, 1997

[54] SYNCHRONIZATION DEVICE FOR OUTPUT STAGES, PARTICULARLY FOR ELECTRONIC MEMORIES

[75] Inventor: Luigi Pascucci, Sesto San Giovanni, Italy

[73] Assignee: SGS-Thomson Microelectronics S.r.l., Agrate Brianza, Italy

[21] Appl. No.: 560,324

[22] Filed: Nov. 17, 1995

[30] Foreign Application Priority Data

Nov. 18, 1994 [EP] European Pat. Off. ............ 94830538

[51] Int. Cl.$^6$ ........................................ G11C 8/00
[52] U.S. Cl. ..................... 365/233; 365/233.5; 365/191
[58] Field of Search .......................... 365/233, 233.5, 365/230.08, 191

[56] References Cited

U.S. PATENT DOCUMENTS 4,858,197  8/1989  Aono et al. ........................ 365/233.5

FOREIGN PATENT DOCUMENTS

A-2 357 979  2/1978  France .......................... G11C 5/00

OTHER PUBLICATIONS

European Search Report from European Patent Application 94830538.8, filed Nov. 18, 1994.
Patent Abstracts of Japan, vol. 10, No. 284 (P–501), Sep. 26, 1986 & JP-A-61 104397 Hitachi.

Primary Examiner—David C. Nelms
Assistant Examiner—F. Niranjan
Attorney, Agent, or Firm—Wolf, Greenfield & Sacks, P.C.; James H. Morris

[57] ABSTRACT

A device that synchronizes an output stage of an electronic memory by enabling the output stage of the memory device after data has been retrieved from the memory, the memory chip is enabled, and output of the memory data is requested. The device also can enable the output stage of the memory regardless of whether the data has been retrieved from the memory based upon receipt of a forced activation signal, and can enable the output stage of the memory for selected bits.

24 Claims, 4 Drawing Sheets

5,633,834

SYNCHRONIZATION DEVICE FOR OUTPUT STAGES, PARTICULARLY FOR ELECTRONIC MEMORIES

BACKGROUND OF THE INVENTION

1. Field of the Invention

The present invention relates to a synchronization device for output stages, particularly for electronic memories.

2. Discussion of the Related Art

It is known that there are two fundamental control pins in electronic memories. The first one, CEN (inverted chip enable), is the pin that enables the memory. The second one, OEN (inverted output enable), is the pin that enables the output stage of the memory.

FIG. 1 is a block diagram of a possible conventional memory, wherein the memory circuit is designated by the reference numeral 1. The memory circuit sends the data to a latch circuit 2, which stores the data before sending them to the output stage 3. The memory circuit 1 is enabled by the CEN signal, that is to say, the circuit is enabled when said signal is equal to "0". The CEN signal and the OEN signal constitute the inputs of a NOR gate 4 which enables the output stage 3 if both input signals are "0".

Accordingly, if the OEN signal is at logic level "1", the output stage 3 is set to a high impedance, and this allows the logic to communicate with the interior of the memory. If instead the OEN signal is set to logic level "0", the output stage 3 is enabled to send out the data produced within the memory. This second operating mode is characterized by a response time that is faster than the corresponding time for the propagation of the data in the memory circuit 1 required to fully read the CEN signal. This means that the output stage 3 can switch randomly or on the basis of data which had been read earlier and is therefore obsolete.

It is known that switching on the outputs produces severe noise on the internal circuits of the memories and in general slows down the read times; the more this event occurs asynchronously and the higher the number of outputs, the slower the read time. Accordingly, it is desirable to avoid false switchings in order to achieve best performance. To deal with this variability in read times, a LOAD signal is generated within the memory circuit, and activates the latch circuit 2 when the datum from the memory circuit 1 reaches it. However, this has no effect on the output stage 3, which may still include false or useless data.

SUMMARY OF THE INVENTION

A principal aim of the present invention is to provide a synchronization device for output stages, particularly for electronic memories, which is capable of synchronizing the output stages of the memories so as to avoid false switching.

Within the scope of this aim, an object of the present invention is to provide a synchronization device for output stages, particularly for electronic memories, that allows better propagation times and facilitates reliability of data on the outputs.

Another object of the present invention is to provide a synchronization device for output stages, particularly for electronic memories, which is capable of handling special situations in an electronic memory.

Another object of the present invention is to provide a device which is highly reliable, relatively easy to manufacture, and at a competitive cost.

This aim, these objects, and others which will become apparent hereinafter are achieved by a synchronization device for output stages, particularly for electronic memories, comprising: a first logic comparison circuit that compares the state of an enable signal of the electronic memory and the state of an enable signal of the output stage of the electronic memory, and generates a first confirmation signal, a flip-flop circuit that is enabled by a data load signal and disabled by the enable signal of the electronic memory, and generates a second confirmation signal, and a second logic comparison circuit that compares the first and second confirmation signals and generates a signal enabling the output stage of the electronic memory.

DETAILED DESCRIPTION

Figure 1:
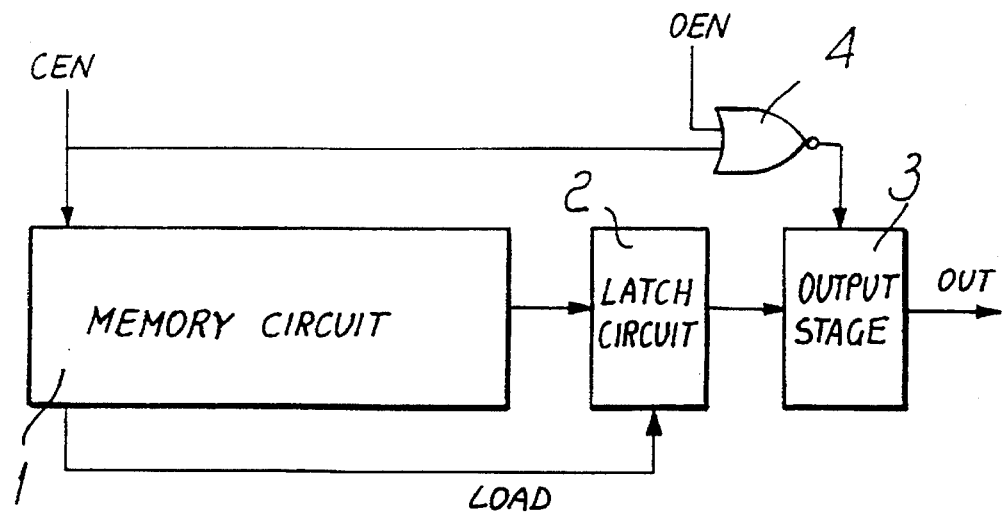
FIG. 1 is a block diagram of a conventional memory.
Figure 2:
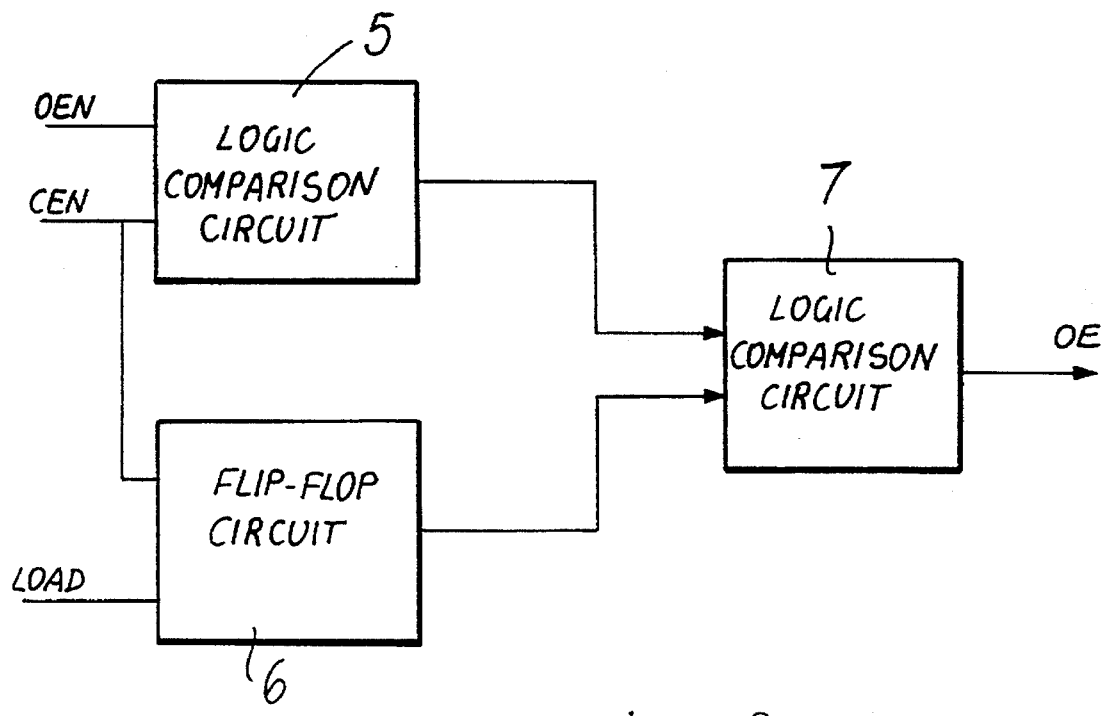
FIG. 2 is a block diagram of the device according to the present invention.

With reference to FIG. 2, the synchronization device according to the present invention comprises a first logic comparison circuit 5 that determines whether the two inputs, memory enable signal CEN and output enable signal OEN, are at the enabling logic level suitable to activate the memory device and its output stage 3 (shown in FIG. 1). Typically, both signals CEN and OEN are at logic level "0" to activate the output stage 3. The memory enable signal CEN is also sent to a flip-flop circuit 6 together with the data load signal LOAD. The signal CEN is sent to the disable input, whereas the signal LOAD is sent to the enable input of the flip-flop circuit 6.

The outputs of the first logic comparison circuit 5 and of the flip-flop circuit 6 are sent to a second logic comparison circuit that generates the actual signal OE that enables the output stage 3 of the memory.

Figure 3:
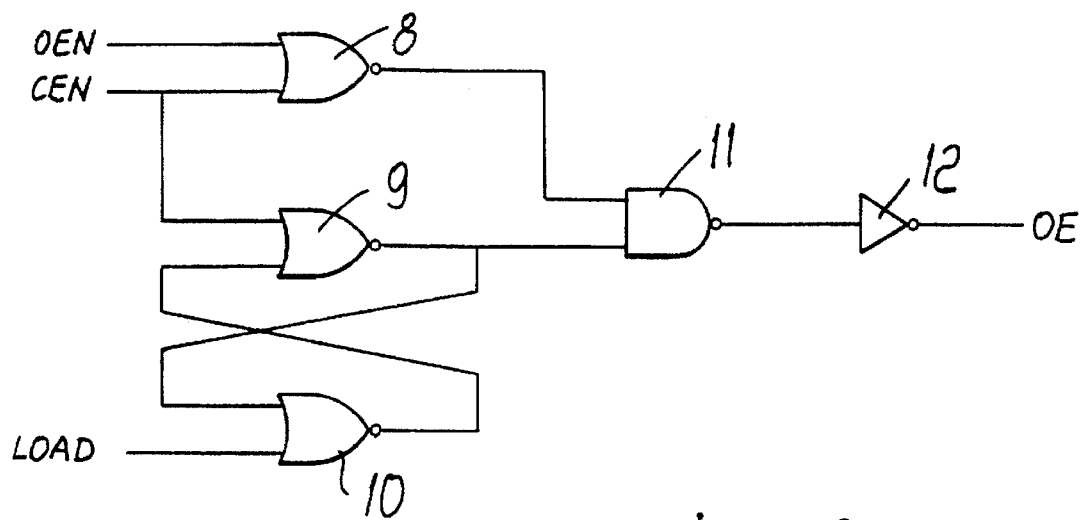
FIG. 3 is a view of an embodiment of the device according to the present invention.

FIG. 3 illustrates an embodiment of the device of FIG. 2. The first logic comparison circuit is constituted by a first NOR gate 8, whereas the flip-flop circuit is constituted by a second NOR gate 9 and by a third NOR gate 10. The output of the third NOR gate 10 is connected to an input of the second NOR gate 9 and vice versa. The memory enable signal CEN is applied to the remaining input of the second NOR gate 9, and the load signal LOAD is applied to the remaining input of the third NOR gate 10. The output of the second NOR gate 9 is the output of the flip-flop circuit.

The outputs of the first logic comparison circuit and of the flip-flop circuit are sent to the second logic comparison circuit, which is constituted by a NAND gate 11 and by an inverting gate 12. The second logic comparison circuit generates the actual signal OE that enables the output stage 3.

The flip-flop circuit 6 is meant to control the enabling of the actual signal OE that enables the output stage. The flip-flop circuit 6 is in fact reset (disabled) by the memory enable signal CEN so as to prevent the first enabling on the part of the enable signal of the output stage OEN. The signal LOAD, which indicates that the data has propagated in the memory, enables the flip-flop circuit 6 for the signal OEN.

The operation of the device according to the present invention is as follows. Every time the signal CEN is set to logic level "1", the flip-flop circuit 6 is reset by the signal CEN itself and the circuit located downstream of said circuit is disabled. This reset condition persists until CEN is equal to logic level "0". The output stage enable signal OEN cannot produce any effect in this configuration, since the first logic comparison circuit 5, that is to say the NOR gate 8, is controlled by the forcing condition of the signal CEN. The data load step, represented by the signal LOAD, is assuredly at logic level "0".

As soon as the memory enable signal CEN is set to logic level "0", the disabled condition of the flip-flop circuit 6 ceases and said flip-flop circuit 6 can be enabled by the signal LOAD (producing a "1" on the output of the second NOR gate 9), which assuredly occurs after a wait time that is equal to the propagation time of a normal data reading operation.

If in the meantime the signal OEN is set to logic level "0", it can propagate, through the first NOR gate 8, as the first confirmation signal to the second logic comparison circuit 7, that is to say, to the NAND gate 11 and to the inverter 12; this, however, produces no effect downstream, since it is necessary to wait for the second confirmation signal that arrives from the flip-flop circuit 6. Said second enabling occurs only at the end of the propagation of the data in the memory, that is to say, as mentioned, when the signal LOAD is enabled.

If instead the signal OEN continues to be kept at logic level "1", then even resetting of the flip-flop circuit 6 does not enable the actual output stage enable signal OE. In these conditions, the first switching of OEN to logic level "0" produces the immediate effect of propagation downstream of the NAND gate 11, consequently enabling the actual output stage enable signal OE and therefore the output stage 3.

Figure 6:
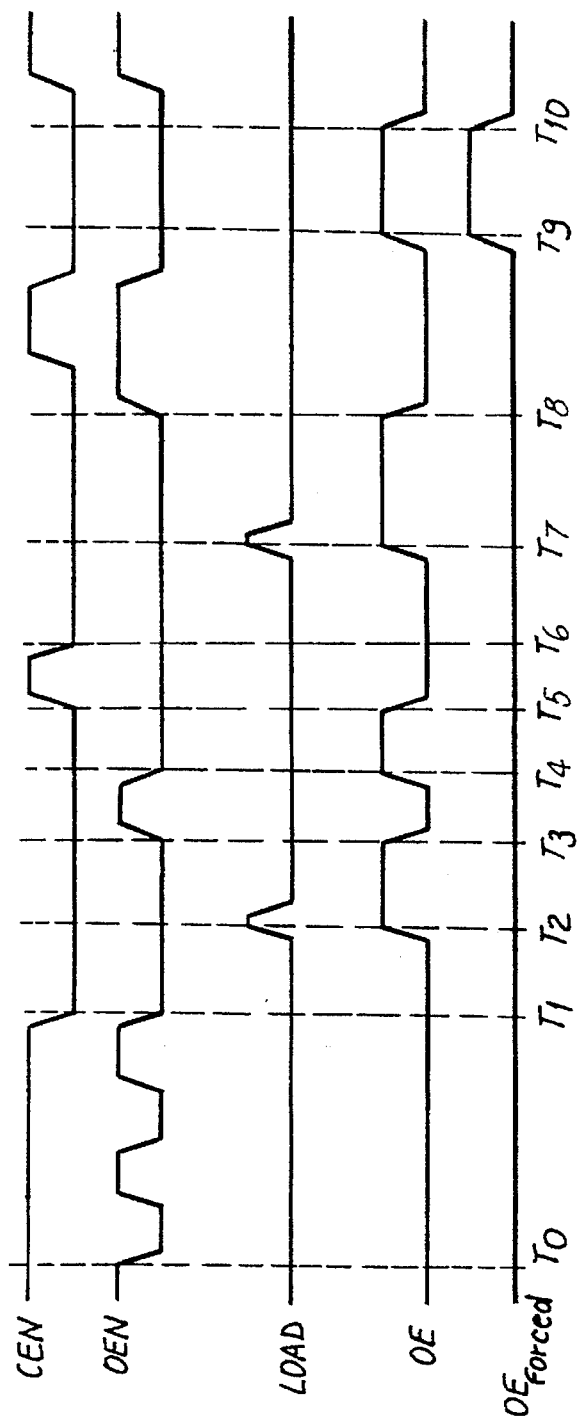
FIG. 6 is a state diagram of the operation of the device according to the present invention.

FIG. 6 illustrates the typical waveforms of the device according to the present invention. Initially, at the time $T_0$, the signal CEN and the signal OEN are at logic level "1" and accordingly the device is not enabled. In fact, during the interval $T_1$-$T_0$ the signal OEN varies from "1" to "0" without any effect, since CEN is always at level "1".

At the time $T_1$, the signals CEN and OEN reach logic level "0" and the device is enabled. However, since a signal LOAD is missing, the actual output stage enable signal OE remains unchanged.

At the time $T_2$, the signal LOAD is sent to the flip-flop circuit 6, and since the signals CEN and OEN are at level "0", the actual signal OE reaches logic level "1" and thus enables the output stage 3.

At the time $T_3$, the output stage enable signal OEN becomes "1" and therefore the actual signal OE also becomes "0".

At the time $T_4$, the signal OEN again reaches "0" and the actual signal OE returns to the enabled state ("1"), since the flip-flop circuit 6 has not been reset by the signal CEN.

At the time $T_5$, the signal CEN reaches logic level "1" and thus disables the actual signal OE even if the signal OEN has remained at logic level "0".

At the time $T_6$, the signal CEN again reaches logic level "0", and thus the device is enabled. When the signal CEN is altered, the flip-flop circuit 6 is reset and a further enabling of the actual signal OE must wait for a new signal LOAD.

At the time $T_7$, after the data propagation time $T_7$-$T_6$, the flip-flop circuit 6 is enabled by a signal LOAD. A logic level "1" is present at the output of the first logic comparison circuit 5, since CEN and OEN are at logic level "0", and therefore the first confirmation signal occurs. A logic level "1" is present at the output of the flip-flop circuit and constitutes the second confirmation signal, which together with the first enabling of the first logic comparison circuit 5 activates the second logic comparison circuit 7 (the NAND gate 11 and the inverter 12), which generate an actual signal OE at logic level "1".

At the time $T_8$, the actual signal is disabled, since the output stage enable signal OEN returns to logic level "1" and the first logic comparison circuit 5 does not produce the first confirmation signal.

Figure 4:
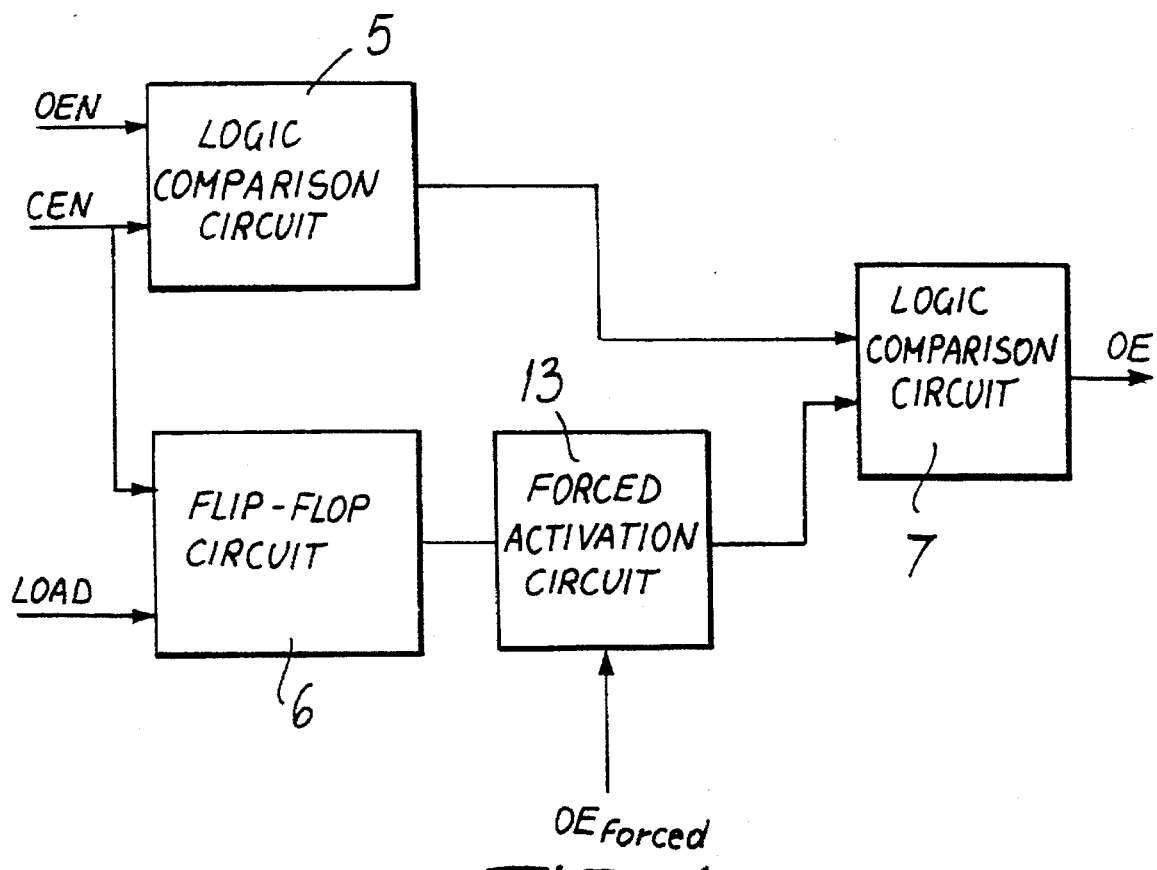
FIG. 4 is a block diagram of a further embodiment of the device according to the present invention.

A further embodiment of the present invention is shown in FIG. 4. The device is identical to the one of FIG. 2, except that a forced activation circuit 13 is interposed between the flip-flop circuit 6 and the second logic comparison circuit 7.

Figure 5:
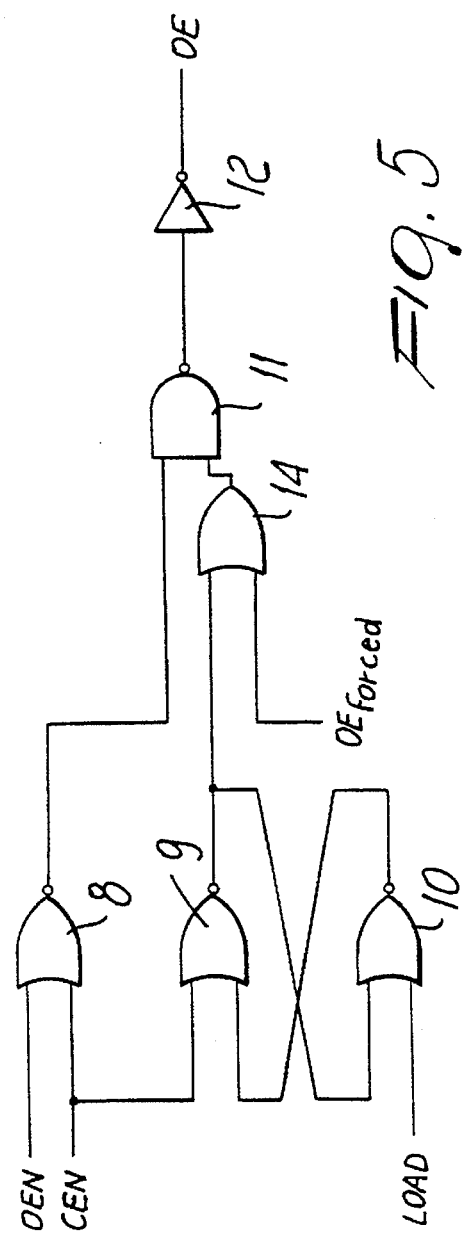
FIG. 5 is a view of an embodiment of the device according to the present invention, shown in FIG. 4.

With reference to FIG. 5, the forced activation circuit can be constituted by an OR gate 14 which, in the presence of a forced signal $OE_{forced}$, generates the second confirmation signal and is thus capable, together with the first logic comparison circuit 5 (the NOR gate 8), of activating the second logic comparison circuit (the NAND gate 11 and the inverter 12) to generate an actual output stage enable signal OE.

This is shown in FIG. 6 in the interval $T_{10}$-$T_9$, where without the presence of a signal LOAD and with the signals CEN and OEN at logic level "0" the signal $OE_{forced}$ is able to force an actual enabling signal OE.

Such a condition is provided for all those special situations in which internal propagation times are negligible and therefore require immediate reading. These special situations may be readings of internal parts such as byte identifiers or registers, testing activities, etcetera.

Figure 7:
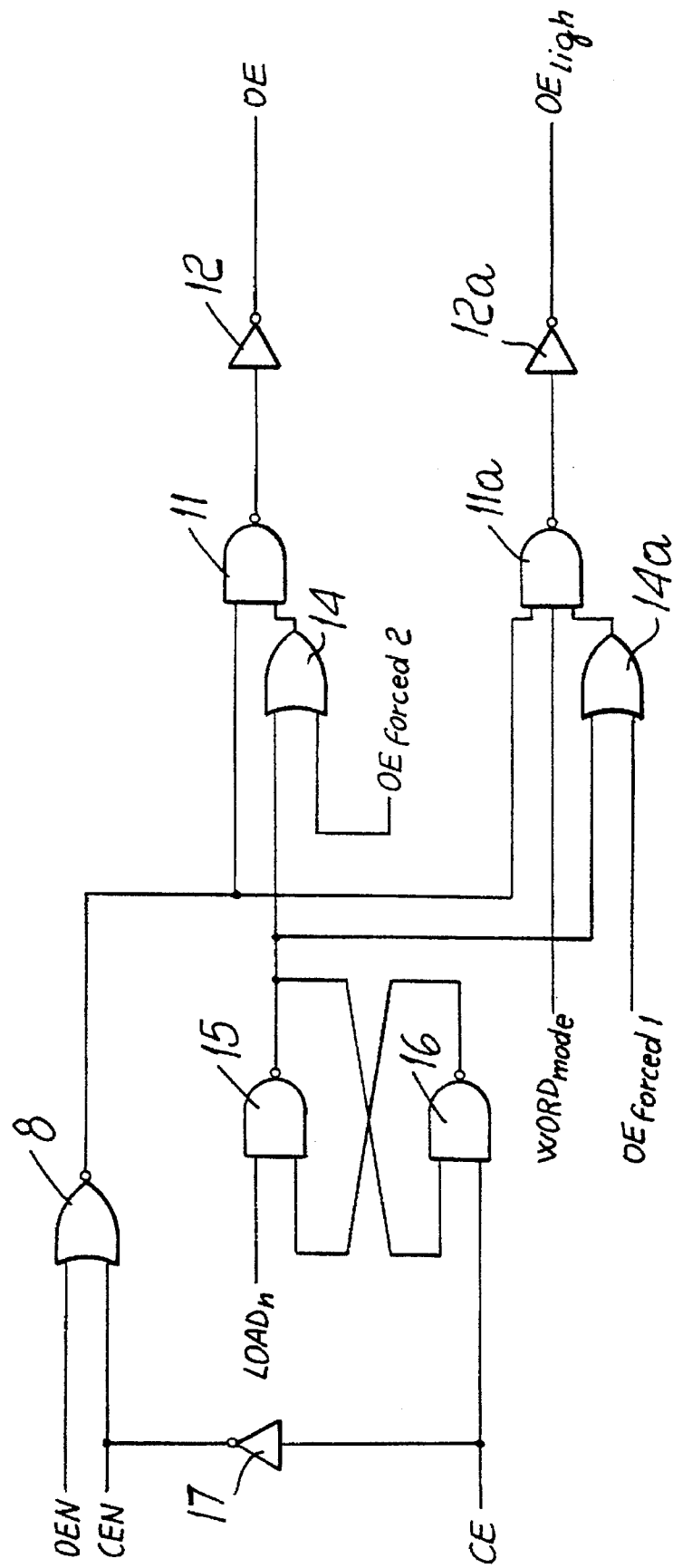
FIG. 7 is a view of another embodiment of the device according to the present invention.

FIG. 7 illustrates another embodiment of the device according to the present invention. Like the embodiments described above, the device is provided with first logic comparison circuit, constituted by a NOR gate 8, to which the signals CEN and OEN are sent.

The device is furthermore provided with a flip-flop circuit which is constituted by two NAND gates 15 and 16. Since in this case NAND gates are used instead of NOR gates as before, the inputs of the flip-flop circuit are an inverted LOAD signal LOADn and an enable signal CE (which is not inverted). The inverted CE signal (CEN) used by the first logic comparison circuit can be generated by way of an inverter 17.

The first logic comparison circuit and the flip-flop circuit is connected to second and third logic comparison circuits. The second logic comparison circuit is constituted, as before, by a NAND gate 11 and by an inverter 12. A forced activation circuit, advantageously constituted by an OR gate 14, are furthermore associated with the second logic comparison circuit.

The third logic comparison circuit is constituted by a three-input NAND gate 11a and by an inverter 12a which are connected in series. In this case, too, a forced activation circuit, constituted by the OR gate 14a, is associated with the third logic comparison circuit.

The output of the second logic comparison circuit is the actual output stage enable signal OE, whereas the output of the third logic comparison circuit is an enable signal $OE_{high}$ for the output stage of the most significant bits. In this manner it is possible to enable the outputs in packets; that is to say, it is possible to enable the output stages in groups.

The particularity of this embodiment resides in the fact that the signal sent to one of the three inputs of the NAND gate 11a is a signal WORD$_{mode}$ for enabling the third logic comparison circuit. This signal is suitable to enable or disable the third logic comparison circuit so as to enable or disable the outputs that it controls. Multiple packets of output stages are controlled in this manner.

The invention thus conceived is susceptible of numerous modifications and variations, all of which are within the scope of the inventive concept.

Clearly, changes may be made to the circuit as described and illustrated herein without, however, departing from the scope of the present invention. Thus, for example, it is possible to provide the devices according to the present invention with combinations of logic gates that are different from those described. All the details may furthermore be replaced with other technically equivalent ones.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A synchronization device for an output stage of an electronic memory comprising:
   a first logic comparison circuit that produces a first confirmation signal based upon a comparison of an enable signal of the electronic memory and an enable signal of the output stage of the electronic memory;
   a flip-flop circuit that produces a second confirmation signal, the flip-flop circuit being enabled by a data load signal and disabled by the enable signal of the electronic memory; and
   a second logic comparison circuit that produces an output signal that enables the output stage of the electronic memory based upon a comparison of the first and the second confirmation signals.

2. A synchronization device according to claim 1, further comprising a forced activation circuit, coupled between the flip flop circuit and the second logic comparison circuit, that produces the second confirmation signal when a forced activation signal is received by the forced activation circuit.

3. A synchronization device according to claim 1, further comprising a third logic comparison circuit connected in parallel with the second logic comparison circuit, and having an input signal that enables and disables the third logic comparison circuit.

4. A synchronization device according to claim 2, further comprising a third logic comparison circuit connected in parallel with the second logic comparison circuit, having an input signal that enables and disables the third logic comparison circuit.

5. A synchronization device according to claim 4, further comprising a forced activation circuit coupled between the flip-flop circuit and the third logic comparison circuit and producing an output signal that forces comparison by the third comparison circuit of the first confirmation signal and the input signal that enables and disables the third logic comparison circuit.

6. A synchronization device according to claim 1, wherein the first logic comparison circuit is a NOR gate.

7. A synchronization device according to claim 1, wherein the flip-flop circuit includes a first NOR gate and a second NOR gate, an output of the first NOR gate connected to an input of the second NOR gate and an output of the second NOR gate connected to an input of the first NOR gate.

8. A synchronization device according to claim 1, wherein the flip-flop circuit includes a first NAND gate and a second NAND gate, an output of the first NAND gate connected to an input of the second NAND gate, and an output of the second NAND gate connected to an input of the first NAND gate.

9. A synchronization device according to claim 1, wherein the second logic comparison circuit includes a NAND gate coupled to an inverter.

10. A synchronization device according to claim 2, wherein the forced activation circuit includes an OR gate.

11. An electronic memory comprising:
    a memory;
    an output stage which outputs data from the memory; and
    enabling means for enabling the output stage when data has been retrieved from the memory in response to a request for a read,
    wherein the enabling means includes:
       a logic circuit for receiving a first signal indicating that a read has been requested,
       a second signal indicating enablement of the output stage has been requested, and
       a third signal indicating data has been retrieved from the memory, the logic circuit outputting an enablement signal to enable the output stage based upon the first, second, and third signals.

12. The electronic memory of claim 11, further comprising:
    a second enabling means for enabling the output stage based upon an indicator signal, independent of whether data has been retrieved from the memory.

13. The electronic memory of claim 11, wherein the logic circuit further includes:
    a first circuit for combining the first signal and the second signal to produce a first confirmation signal;
    a second circuit for combining the first signal and the third signal to produce a second confirmation signal; and
    a third circuit for combining the first confirmation signal and the second confirmation signal to produce the enablement signal.

14. The electronic memory of claim 13, wherein the first circuit includes a NOR gate.

15. The electronic memory of claim 13, wherein the second circuit includes a flip-flop.

16. The electronic memory of claim 13, wherein the third circuit includes a NAND gate coupled to an inverter.

17. The electronic memory of claim 15, wherein the flip-flop includes a first NOR gate and a second NOR gate, an output of the first NOR gate connected to an input of the second NOR gate and an output of the second NOR gate connected to an input of the first NOR gate.

18. The electronic memory of claim 15, wherein the flip-flop includes a first NAND gate and a second NAND gate, an output of the first NAND gate connected to an input of the second NAND gate, and an output of the second NAND gate connected to an input of the first NAND gate.

19. The electronic memory of claim 13, wherein the logic circuit further includes a fourth circuit for combining the first confirmation signal, the second confirmation signal, and a mode signal, and producing an output signal that enables the output stage for selected bits.

20. A method of synchronizing an output stage of an electronic memory comprising the steps of:

producing a first confirmation signal based upon a comparison of an enable signal of the electronic memory and an enable signal of the output stage of the electronic memory;

producing a second confirmation signal based upon a comparison of the enable signal of the electronic memory and a load signal, the load signal indicating data is available from a memory circuit;

producing an output signal to enable the output stage of the electronic memory based upon a comparison of the first confirmation signal and the second confirmation signal.

21. A method of synchronizing the output stage of an electronic memory according to claim 20, wherein the output signal enables the output stage when both the electronic memory is enabled and the output stage of the electronic memory is enabled.

22. A method of synchronizing the output stage of an electronic memory according to claim 21, wherein the output signal enables the output stage when the load signal is received.

23. A method of synchronizing the output stage of an electronic memory according to claim 22, further comprising a step of producing the second confirmation based on a state of a forced input signal.

24. A method of synchronizing the output stage of an electronic memory according to claim 20, further comprising a step of producing a second output signal that enables the output stage of the electronic memory for selected bits based upon a comparison of the first confirmation signal and a mode signal indicative of a mode of operation.

* * * * *